US009477115B2

(12) United States Patent
Ping et al.

(10) Patent No.: US 9,477,115 B2
(45) Date of Patent: Oct. 25, 2016

(54) BACKLIGHT MODULE AND METHOD FOR DETECTING ELECTROSTATIC DAMAGE THEREOF

(71) Applicants:Shanghai AVIC Optoelectronics Co., Ltd., Shanghai (CN); Tianma Micro-Electronics Co., Ltd., Shenzhen (CN)

(72) Inventors: Kangkang Ping, Shanghai (CN); Dekai Chen, Shanghai (CN); Rongrong Jing, Shanghai (CN); Xueping Wu, Shanghai (CN); Zhuocong Li, Shanghai (CN); Zhengyuan Huang, Shanghai (CN)

(73) Assignees: SHANGHAI AVIC OPTOELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 14/220,070

(22) Filed: Mar. 19, 2014

(65) Prior Publication Data

US 2015/0137709 A1    May 21, 2015

(30) Foreign Application Priority Data

Nov. 15, 2013 (CN) .......................... 2013 1 0573290

(51) Int. Cl.
| | | |
|---|---|---|
| G02F 1/1335 | (2006.01) | |
| G01R 31/44 | (2006.01) | |
| G01R 31/26 | (2014.01) | |
| G09G 3/00 | (2006.01) | |
| G09G 3/34 | (2006.01) | |

(52) U.S. Cl.
CPC ..... *G02F 1/133603* (2013.01); *G01R 31/2635* (2013.01); *G01R 31/44* (2013.01); *G09G 3/006* (2013.01); *G09G 3/3406* (2013.01); *G02F 2001/133612* (2013.01); *G09G 2330/10* (2013.01)

(58) Field of Classification Search
CPC ...................................................... G09G 3/006
See application file for complete search history.

(56) References Cited

U.S. PATENT DOCUMENTS

| | | | |
|---|---|---|---|
| 2011/0316011 A1* | 12/2011 | Ito et al. ......................... 257/88 |
| 2014/0266241 A1* | 9/2014 | Innes .................. G01R 19/155 |
| | | | 324/537 |

FOREIGN PATENT DOCUMENTS

| | | | | |
|---|---|---|---|---|
| CN | 2739804 Y | | 11/2005 | |
| DE | 102012201317 | * | 8/2013 | ......... H05B 33/0893 |
| DE | 102012201317 A1 | | 8/2013 | |

OTHER PUBLICATIONS

Current Dividing Circuit, Jan. 22, 2013, Learning about Electroics, p. 1-4, http://web.archive.org/web/20130122052235/http://www.learningaboutelectronics.com/Articles/Current-divider-circuit.php.*

*Primary Examiner* — Tung X Le
*Assistant Examiner* — Raymond R Chai
(74) *Attorney, Agent, or Firm* — Alston & Bird LLP (57) ABSTRACT

A backlight module is disclosed. The backlight module comprises a circuit board, at least one light source disposed on the circuit board, and a positive probe-point and a negative probe-point, both provided on the circuit board. The positive and negative probe-points are electrically connected to the light source, and the positive probe-point and the negative probe-point are electrically connected with a current dividing element so that the light source is connected in parallel with the current dividing element. The positive probe-point and the negative probe-point are also collectively configured to detect an electrostatic damage of the backlight module.

5 Claims, 6 Drawing Sheets

-- Prior Art --

Fig. 1

-- Prior Art --

BACKLIGHT MODULE AND METHOD FOR DETECTING ELECTROSTATIC DAMAGE THEREOF

CROSS-REFERENCES TO RELATED APPLICATIONS

This application claims the benefit of priority to Chinese Patent Application No. 201310573290.4, filed with the Chinese Patent Office on Nov. 15, 2013 and entitled "BACKLIGHT MODULE AND METHOD FOR DETECTING ELECTROSTATIC DAMAGE THEREOF", the content of which is incorporated herein by reference in its entirety.

BACKGROUND OF THE INVENTION

1. Technical Field

The present invention relates to a field of backlight module techniques in liquid crystal displays, and in particularly to a backlight module and a method for detecting an electrostatic damage thereof.

2. Technical Background

Liquid crystal displays are widely used in various electronic communication products, and a backlight module is one of the important components in the liquid crystal display. At present, light emitting diodes (LEDs) are generally used as the light sources in the backlight module. Static electricity is likely generated in various manners in assembling the backlight module, e.g., during stages of producing the LEDs, welding the LEDs to a Flexible Printed Circuit (FPC) board, assembling an LED strip to the backlight module, and the like. During the entire production process from the LED chip production to the assembling of the whole electronic product, an electrostatic damage might be caused to the LEDs by operators, machines, materials and environments, and the prevention of the electrostatic damage has become an emphasis in the industry because the LED, which is a semiconductor element, is vulnerable to the static electricity since the PN junction thereof is directly exposed to the environment. When being applied by a normal operation current, an LED subjected to a severe electrostatic damage exhibits defects such as a current leakage or even cannot emit light, but an LED subjected to a slight electrostatic damage generally will not exhibit any abnormality. However, the LED subjected to a slight electrostatic damage already has a certain potential risk, and would exhibit defects such as darkened emitted light or an increased current leakage or even cannot emit light after the LED is subjected to a secondary electrostatic damage.

Figure 1:
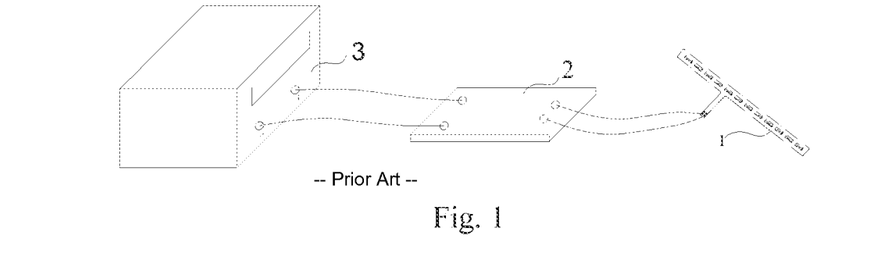
FIG. 1 is a schematic diagram of a method for detecting a failed light in an LED stripe 1 or a backlight module in the prior art.

Since the electrostatic damage cannot be completely avoided so far from the production stages of Liquid Crystal Display Modules (LCMs), measures have been taken in the various production stages to detect whether the LED emits light normally, in order to remove the defective LED damaged by the static electricity. If damaged severely, the LED would become a failed light (that is, the LED is completely damaged, for example, by the static electricity and cannot operate normally), which may generally be found by directly detecting whether the LED normally emits light after the normal operation current is applied to the LED. As shown in FIG. 1, the LED strip or the backlight module (not shown) is connected to a normal power supply 3 through a lighting fixture 2, and an LED from the LED strip or the backlight module may be determined as a failed light or not by detecting whether the LED emits light normally.

In addition, an LED subjected to a slight electrostatic damage, if applied by the normal operation current, can also emit light normally and hence it is not possible to determine whether the LED has been subjected to the slight electrostatic damage. Nonetheless, the LED subjected to the slight electrostatic damage cannot emit light normally if a low current is applied thereto, thus, it is applicable to apply the low current to the LED in order to detect whether the LED has been slightly damaged by the static electricity. If any LED subjected to the slight electrostatic damage is not found, the LED would exhibit defects such as darkened emitted light or an increased current leakage or even cannot emit light, when the LED is subjected to a secondary electrostatic damage, as a result, the whole backlight module and the LCM cannot operate normally, resulting in lower yields and high production costs.

Figure 2:
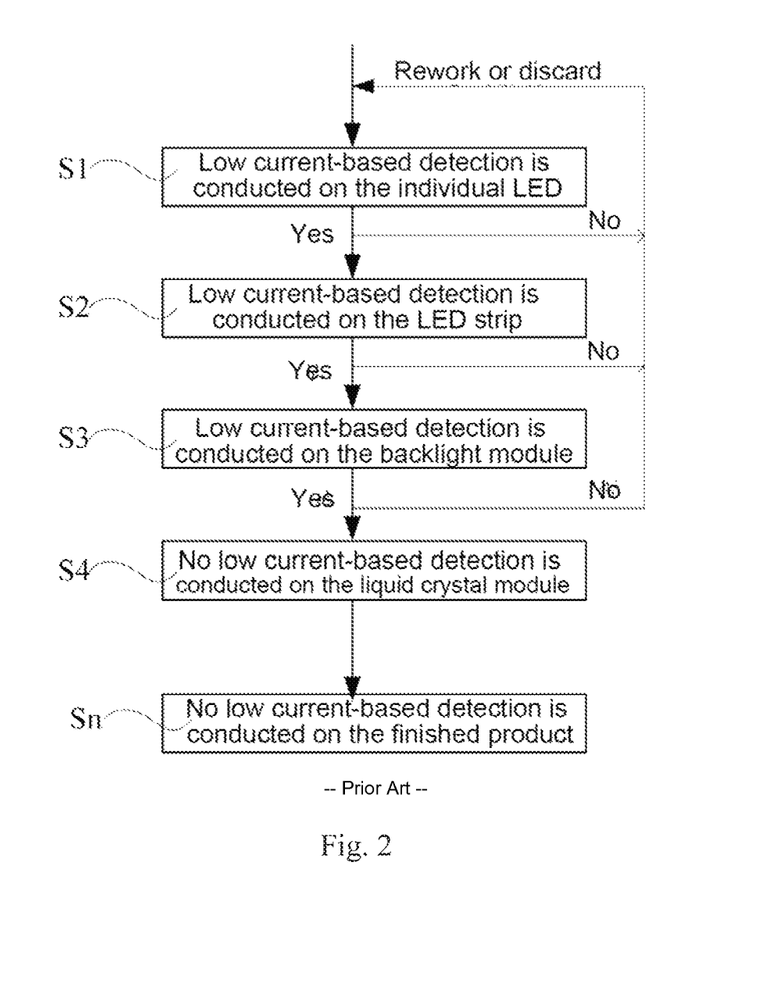
FIG. 2 is a flowchart of a method for detecting an electrostatic damage of the liquid crystal module in the prior art.

FIG. 2 shows the existing LED detection techniques for detecting whether an LED has been damaged by the static electricity. As shown, in Step S1, the low current-based detection is conducted on an individual LED chip to determine whether the individual LED chip emits light normally; in Step S2, the low current-based detection is conducted on an LED strip assembled by LED chips to determine whether the LED strip emits light normally; in Step S3, the low current-based detection is conducted on a backlight module assembled by LED strips to determine whether the backlight module emits light normally; but in Step S4, the low current-based detection can be conducted neither for the LCM assembled by the backlight modules, nor in the subsequent steps. The reason lies in that, after the backlight modules are assembled into the LCM, the current supplied to the LED is limited to a preset rated current having an unchangeable amount, which is a normal operation current instead of a low current, thus the low current-based detection cannot be conducted. However, in the step of assembling the backlight modules into the LCM as well as the subsequent steps, the electrostatic damage is inevitable, but the low current-based detection cannot be conducted for the LEDs in the LCMs, so that potential defective LEDs subjected to the electrostatic damage lead to a risk of the quality of the LCM.

BRIEF SUMMARY OF THE INVENTION

One embodiment is a backlight module. The backlight module comprises a circuit board, at least one light source disposed on the circuit board, and a positive probe-point and a negative probe-point, both provided on the circuit board. The positive and negative probe-points are electrically connected to the light source, and the positive probe-point and the negative probe-point are electrically connected with a current dividing element so that the light source is connected in parallel with the current dividing element. The positive probe-point and the negative probe-point are also collectively configured to detect an electrostatic damage of the backlight module.

Another embodiment is method of detecting an electrostatic damage of a backlight module. The method comprises providing a current dividing element, and providing a backlight module. The backlight module comprises a circuit board and at least one light source disposed on the circuit board. The method also includes providing a detection power supply configured to apply a first detection current, applying the first detection current to the light source by electrically connecting the detection power supply with the light source, and connecting the current dividing element in parallel with the light source so that a second detection current is applied to the light source, where the second detection current is divided from the first detection current. The method also includes determining, based on the second detection current applied on the light source, whether the light source is damaged.

For the problems presented in the prior art, an object of the invention is to provide a backlight module, a method for detecting an electrostatic damage of the backlight module, and a liquid crystal module.

According to an exemplary embodiment of the invention, there is provided a backlight module, and the backlight module includes: a circuit board; at least one light source disposed on the circuit board; and at least one positive probe-point and at least one negative probe-point, both provided on the circuit board and electrically connected to the light source; where the positive probe-point and the negative probe-point are electrically connected with a current dividing element so that the light source is connected in parallel with the current dividing element, to detect an electrostatic damage of the backlight module.

According to an exemplary embodiment of the present invention, there is provided a method for detecting an electrostatic damage of a backlight module, and the method includes steps of:

providing a current dividing element;

providing a backlight module, which includes: a circuit board and at least one light source disposed on the circuit board;

providing a detection power supply configured to apply a first detection current; applying the first detection current on the light source, by electrically connecting the detection power supply with the light source;

connecting the current dividing element in parallel with the light source, so that a second detection current which is a low current applied on the light source is divided from the first detection current; and determining, by the second detection current applied on the light source, whether the light source is damaged, and if a light source emits light normally, the light source has not been subjected to the electrostatic damage; else if the light source does not emit light normally, the light source has been subjected to the electrostatic damage.

According to an exemplary embodiment of the present invention, there is provided a liquid crystal display module which includes the above backlight module.

With the technical solution described above, the present invention discloses a backlight module and a method for detecting an electrostatic damage thereof, where the backlight module can achieve the detection for the electrostatic damage of the LED under the low current condition even after the backlight module is assembled into the liquid crystal display module, as compared with the prior art.

BRIEF DESCRIPTION OF THE DRAWINGS

In order to more clearly illustrate the technical solutions of the embodiments of the invention, the drawings used for the description of the embodiments are briefly introduced below. Obviously, the drawings for the following description only show some embodiments of the invention, and other drawings may also be obtained from the described drawings by those skilled in the art without any creative work.

DETAILED DESCRIPTION OF THE INVENTION

The technical solutions in the embodiments of the present invention are clearly and completely described below in combination with the drawings. Obviously, the described embodiments are some instead of all embodiments of the present invention. All other embodiments obtained in light of the described embodiments of the invention by those skilled in the art without any creative work should fall within the protection scope of the present invention.

The present invention discloses a backlight module and a method for detecting an electrostatic damage thereof, where the backlight module includes a backlight module, a circuit board; at least one light source disposed on the circuit board; and at least one positive probe-point and at least one negative probe-point, both provided on the circuit board and electrically connected to the light source; where the positive probe-point and the negative probe-point are connected with a current dividing element so that the light source is connected in parallel with the current dividing element, to detect an electrostatic damage of the backlight module. The backlight module can achieve the detection for the electrostatic damage of the LED under the low current condition even after the backlight module is assembled into the liquid crystal display module, as compared with the prior art.

First Embodiment

Figure 3:
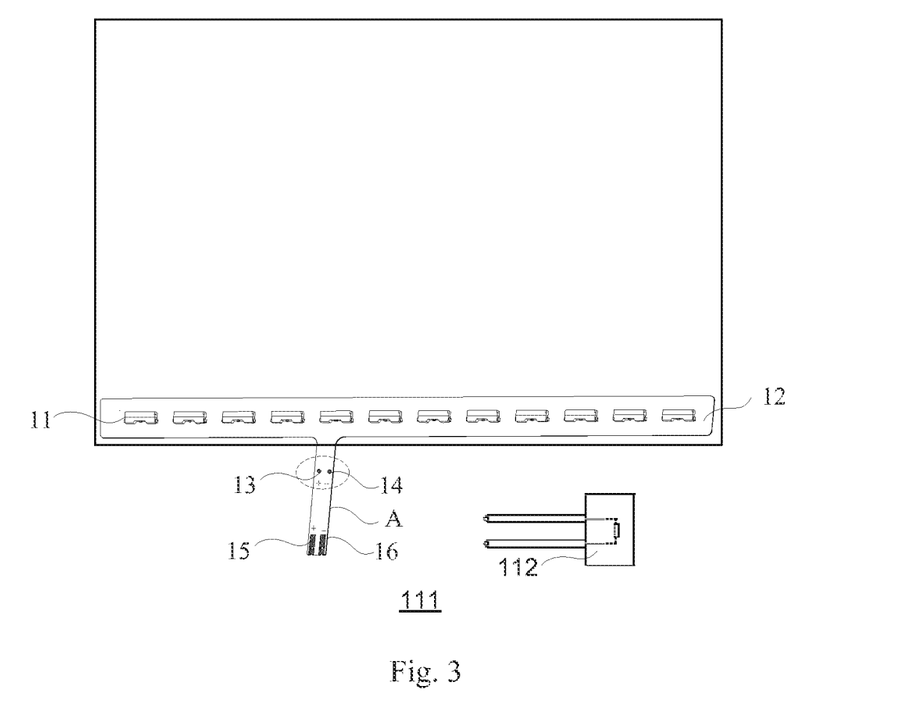
FIG. 3 is a schematic diagram of a backlight module according to the present invention.
Figure 4:
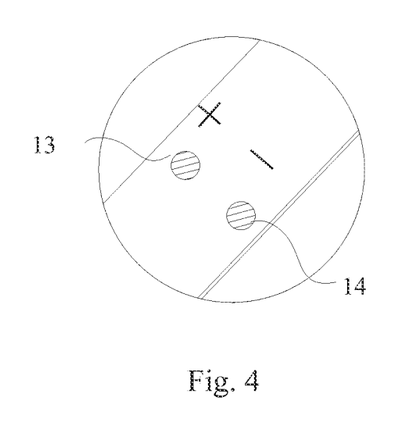
FIG. 4 is a partially enlarged view of the portion enclosed by the dashed line in FIG. 3.
Figure 5:
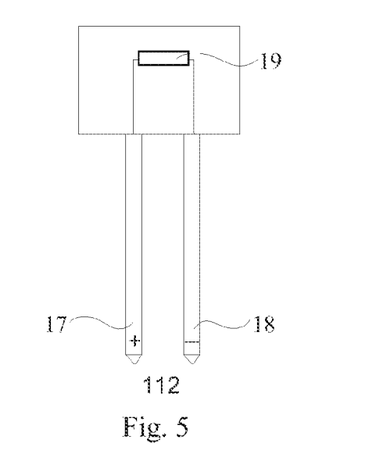
FIG. 5 is a schematic diagram of a current dividing element 112 in FIG. 3.

As shown in FIGS. 3 to 5, the present invention discloses a backlight module 111, which includes a circuit board 12 and at least one light source 11 disposed on the circuit board 12. The light source 11 is generally composed by LEDs, which may be connected in series with each other, or may be formed by parallel LED groups each including serially connected LEDs; and the circuit board 12 includes an FPC board.

As shown in FIG. 4 (which shows a partially enlarged view of the portion enclosed by a dashed line in FIG. 3), the light source module 111 further includes at least one positive probe-point 13 and at least one negative probe-point 14, which are both disposed on the circuit board 12 (specifically disposed on a projecting portion A of the circuit board 12), and are electrically connected to the light source 11, that is, conductive wires are arranged on the circuit board 12 to conduct the positive probe-point 13 and the negative probe-point 14 with the light source 11. The positive probe-point 13 and the negative probe-point 14 arranged on the board 12 are configured for electrically connecting to a current dividing element 112 so that the light source 11 is connected in parallel with the current dividing element 112, to detect the electrostatic damage of the backlight module.

Referring to FIG. 3 again, the backlight module 111 further includes detection pins 15 and 16 provided on the circuit board 12 and electrically connected to the light source 11, that is, conductive wires are arranged on the circuit board 12 to conduct the detection pins 15 and 16 with the light source 11. The detection pins 15 and 16 are generally disposed on the projecting portion A of the circuit board 12, and configured to connect an external detection power supply 11 to detect the electrostatic damage or a failed light in the light source 11.

As shown in FIG. 3, the backlight module 111 is structural separately from the current dividing element 112 in the present embodiment.

As shown in FIG. 5, the current dividing element 112 includes at least one first resistor 19, at least one positive probe 17, and at least one negative probe 18. The first resistor 19 is electrically connected to both the positive probe 17 and the negative probe 18, that is, both ends of the first resistor 19 are respectively connected to the positive probe 17 and the negative probe 18 by conductive wires. It is noted that the first resistor 19 includes at least one first variable resistor or at least one first constant resistor.

Figure 10:
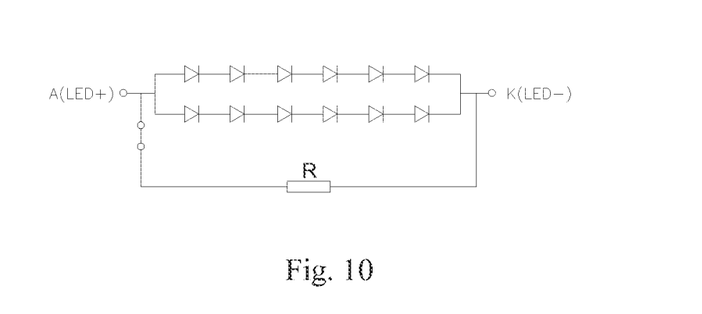
FIG. 10 is a schematic diagram showing the equivalent circuit in detecting the electrostatic damage of the backlight module according to the second embodiment of the present invention.

Referring to FIGS. 3 and 5 again, to detect the electrostatic damage of the backlight module 111, the positive probe 17 is connected to the positive probe-point 13 and the negative probe 18 is connected to the negative probe-point 14, so that the first resistor 19 is connected in parallel with the light source 11, resulting in an equivalent circuit diagram shown in FIG. 10. Specifically, to detect the electrostatic damage of the backlight module 111, the external current is typically applied directly to the light source 11 by an external power supply connected to the detection pins 15 and 16, in order to determine whether any electrostatic damage has occurred to the light source 11. If the amount of the current applied by the external power supply is uncontrollable, especially if the amount of the current applied by the external power supply is large, any light source subjected to the slight electrostatic damage cannot be detected, and such light source will exhibit defects such as darkened emitted light or an increased current leakage or even cannot emit light after the light source suffers from a secondary electrostatic damage. To solve the problem caused by the uncontrollable amount of the current applied by the external power supply, the first resistor 19, which is the first variable resistor with adjustable resistance, is connected in parallel to the light source 11 on the backlight module 111 in the present embodiment, so that the external current applied on the light source 11 can be divided by the first resistor 19, and a low current for detecting the electrostatic damage suffered by the light source is divided from the external current by adjusting the amount of the resistance of the first resistor 19. Alternatively, if the first resistor 19 is a first constant resistor, the division of the low current from the external current can be implemented by replacing the first resistor 19 with a constant resistor having different resistance.

It is also noted that in the case of a plurality of light sources 11 which are typically LEDs, if the LEDs are connected in series with each other, the low current for detecting the presence of an electrostatic damage of any LED generally has an amount of 0.5-1 mA, that is, the amount of the current applied on each of the serially connected LEDs is 0.5-1 mA; otherwise, if the light sources 11 are composed by parallel LED groups each of which is formed by a plurality of serially connected LEDs, the low current for detecting the presence of an electrostatic damage in the LED has such an amount that the current applied on each of the serially connected LEDs in each of the LED groups has an amount of 0.5-1 mA, as such, the amount of the low current is not constant.

Further, the positive probe-point 13 and the negative probe-point 14 are provided on the projecting portion A of the circuit board 12, so that the positive probe-point 13 and the negative probe-point 14 are exposed even after the assembly of the backlight module 111 into the liquid crystal display module since the positive and negative probe-points are both located on the projecting portion of the circuit board 12. As such, it is easy and convenient to connect the current dividing element 112 with the positive probe-point 13 and the negative probe-point 14 to detect the electrostatic damage of the backlight module 111.

Second Embodiment

Figure 7:
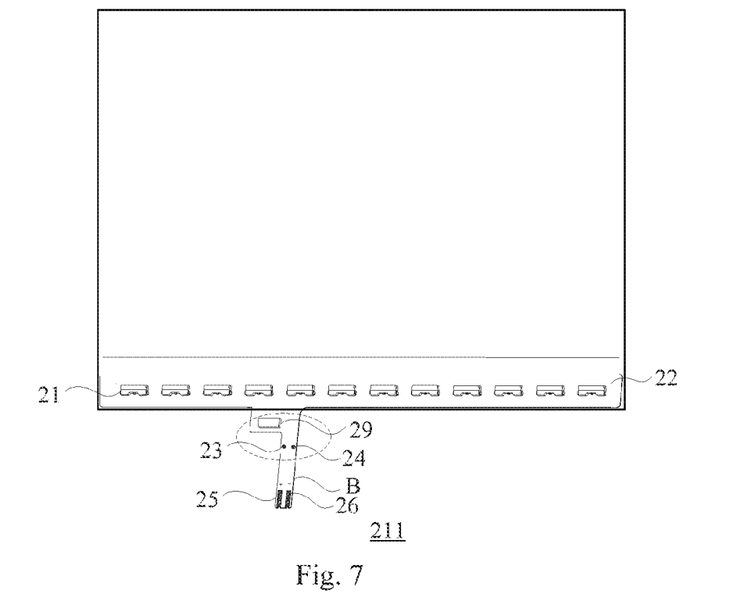
FIG. 7 is a schematic diagram of a backlight module according to a second embodiment of the present invention.
Figure 8:
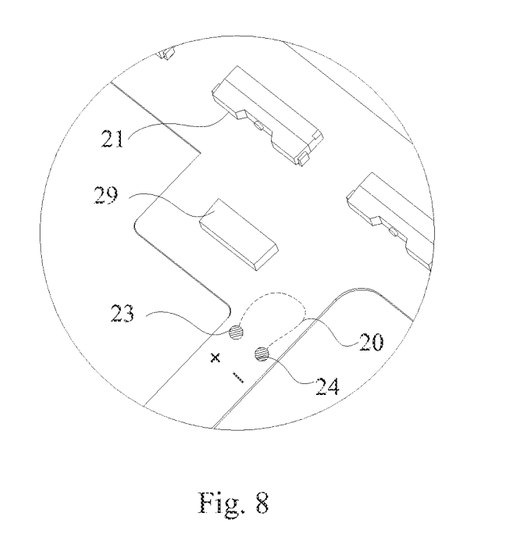
FIG. 8 is a partially enlarged view of the portion enclosed by the dashed line in FIG. 7.

Base on the disclosed first embodiment of the present invention, the invention further discloses a backlight module 211. The backlight module 211 includes: a circuit board 22; at least one light source 21 disposed on the circuit board 22; detection pins 25 and 26 disposed on a projecting portion B of the circuit board 22; and at least one positive probe-point 23 and at least one negative probe-point 24, which are both provided on the circuit board 22, (specifically on a projecting portion B of the circuit board 22), and are electrically connected with the light source 21. The light source 21 is generally composed by LEDs which may be connected in series with each other, or may be formed by parallel LED groups each including serially connected LEDs; and the circuit board 22 includes an FPC board. The positive probe-point 23 and the negative probe-point 24 arranged on the board 22 are configured for electrically connecting to a current dividing element so that the light source 21 is connected in parallel with the current dividing element, to detect the electrostatic damage of the backlight module 211.

As shown in FIG. 7, the present embodiment is different from the first embodiment in that the backlight module 211 is formed integrally with the current dividing element.

Figure 9:
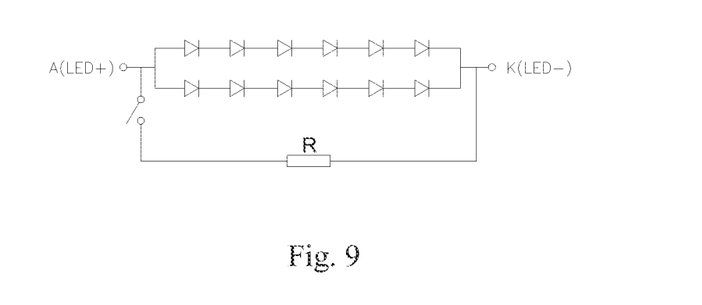
FIG. 9 is a schematic equivalent circuit diagram of the backlight module according to the second embodiment of the present invention.

As shown in FIG. 8 (which is a partially enlarged view of the portion enclosed by the dashed line in FIG. 7), the current dividing element includes at least one second resistor 29, which includes at least one second variable resistor or at least one second constant resistor, disposed on a side of the circuit board 22, preferably disposed on the projecting portion B of the circuit board 22, but the present invention is not limited thereto. When the detection of the electrostatic damage is not conducted for the backlight module 211, the second resistor 29 is disconnected from the light source 21, resulting in an equivalent circuit diagram shown in FIG. 9 in which the electrical circuit connections may be realized by the arranged conductive wires on the circuit board 21. When a normal operating voltage is applied across light source 21, the light source 21 is in a normal operating state, and the second resistor 29 is disconnected from the light source 21.

Referring to FIG. 8 again, to detect the electrostatic damage of the backlight module 211, the positive probe-point 23 is connected to the negative probe-point 24 by an external conductive wire 20, so that the second resistor 29 is connected in parallel with the light source 21, resulting in an equivalent circuit diagram shown in FIG. 10. That is, The connection between the positive probe-point 23 and the negative probe-point 24 by the external conductive wire 20 enables the positive probe-point 23 and the negative probe-point 24 to serve as a switch, as a result, when the positive probe-point 23 and the negative probe-point 24 are connected with each other, the second resistor 29 is connected in parallel with the light source for the purpose of current division; and when the positive probe-point 23 and the negative probe-point 24 are disconnected from each other, the second resistor 29 is not in electrical connection with the light source 21. The current dividing element, i.e. the second resistor 29, is formed directly on the circuit board 22, so that the electrostatic damage of the backlight module 211 can be detected more simply.

The present embodiment is based on the first embodiment, and parts in the present embodiment the same as those of the first embodiment will not be described again herein.

Third Embodiment

Figure 11:
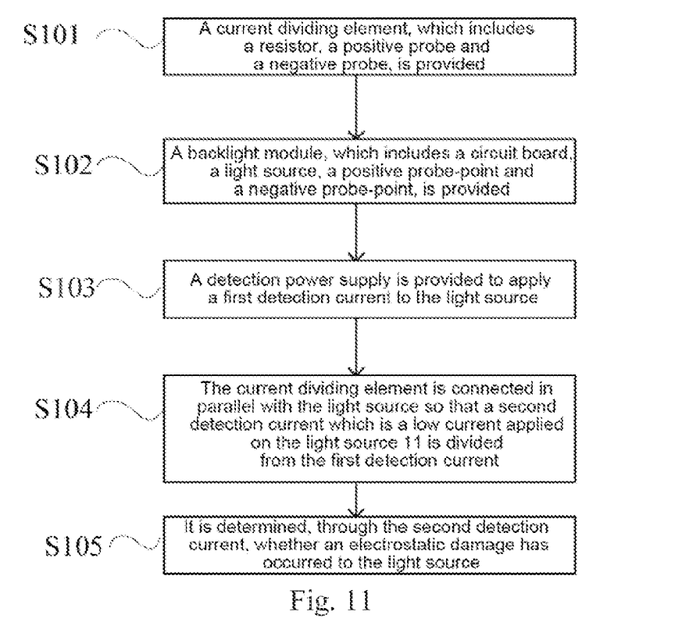
FIG. 11 is a schematic diagram of the method for detecting the electrostatic damage of the backlight module according to a third embodiment of the present invention.

As shown in FIGS. 3 and 11, based on the disclosed first embodiment of the present invention, the present invention further discloses a method for detecting an electrostatic damage of a backlight module, and the method includes Steps S101 to S105 as follows.

In Step S101, a current dividing element 112 is provided. The current dividing element 112 includes at least one first resistor 19, at least one positive probe 17 and at least one negative probe 18, where the first resistor 19 is electrically connected with the positive probe 17 and the negative probe 18, that is, both ends of the first resistor 19 are respectively connected to the positive probe 17 and the negative probe 18 by conductive wires. It is noted that the first resistor 19 at least includes a first variable resistor or a first constant resistor.

In Step S102, a backlight module 111 is provided. The backlight module 111 includes: a circuit board 12 (which is typically a Flexible Printed Circuit board); at least one light source 11 disposed on the circuit board 12; and the positive probe-point 13 and the negative probe-point 14, which are both disposed on the circuit board 12, specifically on the projecting portion A of the circuit board 12, and are electrically connected with the light source 11. The backlight module 111 further includes detection pins 15 and 16 provided on the circuit board 12 and electrically connected to the light source 11, that is, the circuit board 12 is provided with conductive wires for conducting the detection pins 15 and 16 with the light source 11.

In Step S103, a detection power supply is provided to apply a first detection current $I_1$ (the amount of which may be constant, or be preset as unchangeable) to the light source 11, that is, the detection power supply is electrically connected with the light source 11, in particularly, the detection power supply applies the first detection current $I_1$ to the light source 11 through the detection pins 15 and 16 on the circuit board 12.

In Step S104, the current dividing element 112 is connected in parallel with the light source 11 so that a second detection current $I_2$ which is a low current applied on the light source 11 is divided from the first detection current $I_1$, in particularly, the positive probe 17 of the current dividing element 112 is electrically connected with the positive probe-point 13 on the circuit board 12, and the negative probe 18 of the current dividing element 112 is electrically connected with the negative probe-point 14 on the circuit board 12, to connect the first resistor 19 in parallel with the light source 11, so that the second detection current $I_2$ which is a low current applied on the light source 11 is divided from the first detection current $I_1$.

In Step S105, it is determined, through the second detection current $I_2$ applied on the light source 11, whether the light source 11 has been subjected to an electrostatic damage. If the light source 11 emits light normally, the light source 11 has not been subjected to the electrostatic damage; and if the light source 11 does not emit light normally, the light source 11 has been subjected to the electrostatic damage. The second detection current $I_2$ is the low current for determining whether the electrostatic damage has occurred to the light source 11, and is smaller than the first detection current $I_1$.

Figure 6:
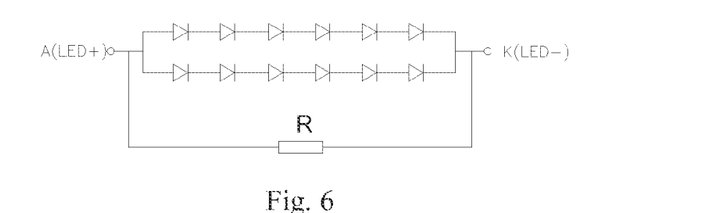
FIG. 6 is a schematic diagram showing the equivalent circuit in detecting the electrostatic damage of the backlight module according to the first embodiment of the present invention.

Referring to FIGS. 3, 5, and 11 again, in S104, to detect the electrostatic damage of the backlight module 111, the positive probe 17 is connected to the positive probe-point 13 and the negative probe 18 is connected to the negative probe-point 14, so that the first resistor 19 is connected in parallel with the light source 11, resulting in an equivalent circuit diagram shown in FIG. 6. Specifically, to detect the electrostatic damage of the backlight module 111, the first detection current $I_1$ (external current) is typically applied directly to the light source 11 by an external power supply through the detection pins 15 and 16, in order to determine whether any electrostatic damage has occurred in the light source 11. If the amount of the first detection current $I_1$ is uncontrollable or is preset as unchangeable, especially if the amount of the first detection current $I_1$ is large, any light source subject to the slight electrostatic damage cannot be detected, and, such light source will exhibit defects such as a darkened emitted light, or an increased current leakage or even cannot emit light after the light source suffers from a secondary electrostatic damage. To solve the problem caused by the uncontrollable amount of the first detection current $I_1$, the first resistor 19, which is the first variable resistor with adjustable resistance, is connected in parallel to the light source 11 on the backlight module 111 in the present embodiment, so that the first detection current $I_1$ applied on the light source 11 can be divided by the first resistor 19, and the second detection 12, which is a low current for detecting whether the electrostatic damage has occurred to the light source, is divided from the first detection current $I_1$ by adjusting the amount of the resistance of the first variable resistor 19. Alternatively, if the first resistor 19 is a first constant resistor, the division of the low current from the first detection current $I_1$ can be implemented by replacing the first resistor 19 with a constant resistor having different resistance.

It is also noted that in S104 and S105, in the case of a plurality of light sources 11 which are typically LEDs, if the LEDs are connected in series with each other, the low second detection current $I_2$ for detecting the presence of an electrostatic damage of any LED generally has an amount of 0.5-1 mA, that is, the amount of the current applied on each of the serially connected LEDs is 0.5-1 mA; otherwise, if the light sources 11 are composed by parallel LED groups, each of which is formed by a plurality of serially connected LEDs, the low second detection current $I_2$ for detecting the presence of an electrostatic damage in the LED has such an amount that the current applied on each of the serially connected LEDs in each of the LED groups has an amount of 0.5-1 mA, as such, the amount of the low second detection current $I_2$ is not constant.

Further, in S102 and S104, the positive probe-point 13 and the negative probe-point 14 are provided on a projecting portion of the circuit board 12, so that the probe-point 13 and the negative probe-point 14 are exposed even after the assembly of the backlight module 111 into the liquid crystal display module since the positive and negative probe-points are both located on the projecting portion A of the circuit board 12. As such, it is easy and convenient to connect the current dividing element 112 with the positive probe-point 13 and the negative probe-point 14 to detect the electrostatic damage of the backlight module 111.

Fourth Embodiment

As shown in FIGS. 7 to 10 and FIG. 12, based on the disclosed second and third embodiments of the present invention, the present invention further discloses a method for detecting an electrostatic damage of a backlight module, and the method includes Steps S201 to S205 as follows.

Figure 12:
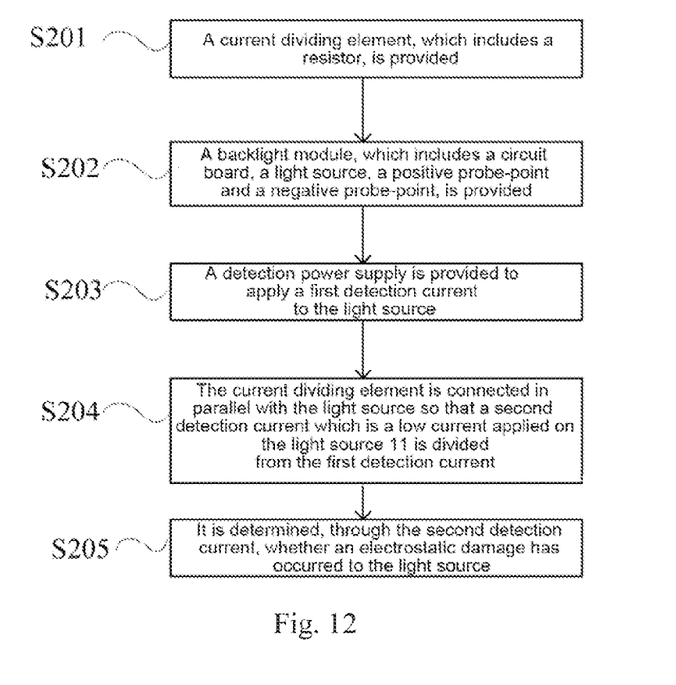
FIG. 12 is a schematic diagram of the method for detecting the electrostatic damage of the backlight module according to a fourth embodiment of the present invention.

In Step S201, a current dividing element is provided. The current dividing element includes at least one second resistor 29. It is noted that the second resistor 29 includes at least a second variable resistor or a second constant resistor.

In Step S202, a backlight module 211 is provided. The backlight module 211 includes: a circuit board 22 (which is typically a Flexible Printed Circuit board); at least one light source 21 disposed on the circuit board 22; and the positive probe-point 23 and the negative probe-point 24, which are both disposed on the circuit board 22, specifically on the projecting portion B of the circuit board 22, and are electrically connected with the light source 21. The backlight module 211 further includes detection pins 25 and 26 provided on the circuit board 22 and electrically connected to the light source 21, that is, the circuit board 22 is provided with conductive wires for conducting the detection pins 25 and 26 with the light source 21. The current dividing element provided on a side of the circuit board 22 is contained in the backlight module 211. When the detection of the electrostatic damage is not conducted for the backlight module 211, the second resistor 29 is disconnected from the light source 21, resulting in an the equivalent circuit diagram shown in FIG. 9 in which the electrical circuit connections may be realized by the arranged conductive wires on the circuit board 21.

In Step S203, a detection power supply is provided to apply a first detection current $I_1$ (the amount of which may be constant, or be preset as unchangeable) to the light source 21, that is, the detection power supply is electrically connected with the light source 11, in particularly, the detection power supply applies the first detection current $I_1$ to the light source 21 through the detection pins 25 and 26 on the circuit board 22.

In Step S204, the current dividing element is connected in parallel with the light source 11 so that a second detection current $I_2$ which is a low current applied on the light source 21 is divided from the first detection current $I_1$, in particularly, with reference to FIG. 8 again, the positive probe-point 23 is connected to the negative probe-point 24 by an external conductive wire 20, to connect the second resistor 29 in parallel with the light source 21, resulting in an equivalent circuit diagram shown in FIG. 10, so that the second detection current $I_2$ which is a low current applied on the light source 21 is divided from the first detection current $I_1$.

In Step S205, it is determined, through the second detection current $I_2$ applied on the light source 21, whether the light source 21 has been subjected to an electrostatic damage. If the light source 21 emits light normally, the light source 21 has not been subjected to the electrostatic damage; if the light source 21 does not emit light normally, the light source 21 has been subjected to the electrostatic damage. The second detection current $I_2$ is the low current for determining whether the electrostatic damage has occurred to the light source 21, and is smaller than the first detection current $I_1$;

It is noted that, to detect the electrostatic damage of the backlight module 211, in Step S204, the connection between the positive probe-point 23 and the negative probe-point 24 by the external conductive wire 20 enables the positive probe-point 23 and the negative probe-point 24 to serve as a switch, as a result, when the positive probe-point 23 and the negative probe-point 24 are connected with each other, the second resistor 29 is connected in parallel with the light source, for the purpose of the current division; and when the positive probe-point 23 and the negative probe-point 24 are disconnected from each other, the second resistor 29 is not in electrical connection with the light source 21. The current dividing element, i.e. the second resistor 29, is formed directly on the circuit board 22, so that the electrostatic damage of the backlight module 211 can be detected more simply.

In Steps S204 and S205, in the case of a plurality of light sources 21 which are typically LEDs, if the LEDs are connected in series with each other, the second detection current $I_2$ generally has an amount of 0.5-1 mA; otherwise, If the light sources are composed by a parallel LED groups each of which is formed by a plurality of serially connected LEDs, the low second detection current $I_2$ for detecting the presence of the electrostatic damage in the LED has such an amount that the current applied on each of the serially connected LEDs in each of the LED groups has an amount of 0.5-1 mA, as such, the amount of the low second detection current $I_2$ is not constant. The amount of the second detection current $I_2$ can be controlled by adjusting the second variable resistor or replacing the second constant resistor.

The present embodiment is based on the second and third embodiments, and the parts in the present embodiment same as those of the second and third embodiments will not be described again herein.

Fifth Embodiment

Figure 13:
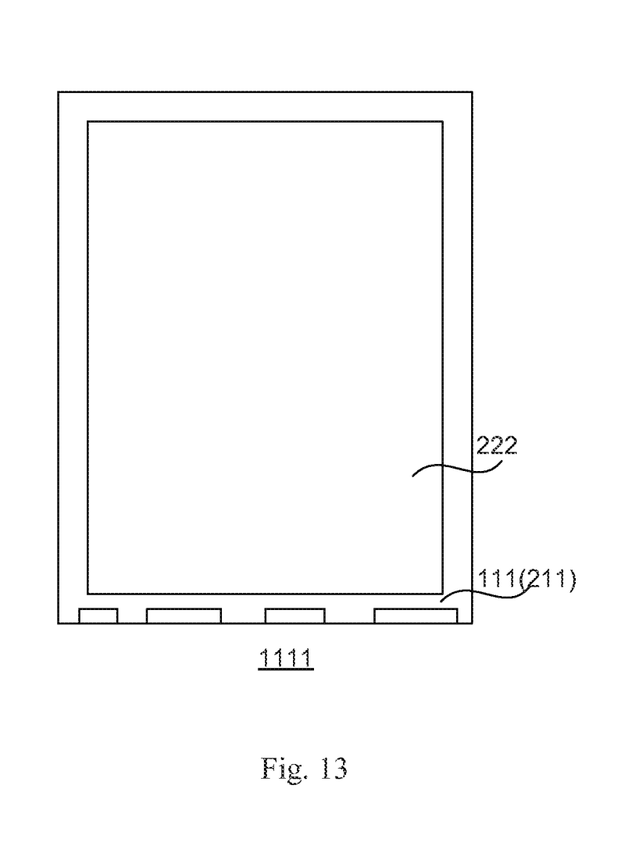
FIG. 13 a schematic diagram of a liquid crystal display module according to a fifth embodiment of the present invention.

As shown in FIG. 13, based on the disclosed first and second embodiments of the present invention, the present invention further discloses a liquid crystal display module 1111 which includes the backlight module 111 provided by the first embodiment or the backlight module 211 provided by the second embodiment. The liquid crystal display module 1111 further includes a liquid crystal display panel 222. The liquid crystal display module 1111 has a function of low current-based detection for determining whether an electrostatic damage has occurred to the light source of the backlight module 111 or 211 of the liquid crystal display module 1111, thus reducing the potential defective LEDs subjected to the electrostatic damage in the step for assembling the liquid crystal display module (LCM) and subsequent process steps, and improving the production yields.

The various sections in the specification are described in a progressive manner, and differences of the subsequent sections from the previous sections are illustrated. Therefore, the same or similar parts in various sections can be referred to each other.

The above disclosed embodiments are described for implementing or using the present invention by those skilled in the art. It will be apparent that various modifications can be made to these embodiments by those skilled in the art, and the general principles defined by the present invention can be implemented in other embodiments without departing from the spirit or the protection scope of the present invention. Therefore, the present invention is not limited by the embodiments shown herein, rather conforms to the broadest range in accordance with the principles and novelty characteristics disclosed.

What is claimed is:

1. A backlight module, comprising:
a circuit board;
at least one light source disposed on the circuit board;
a current dividing element disposed on the circuit board; and
a positive probe-point and a negative probe-point, both located on the circuit board and electrically connected to the light source, wherein, the positive probe-point and the negative probe-point are disposed on a projecting portion of the circuit board;
the positive probe-point is connected to a terminal A of the light source, the negative probe-point is connected to a first terminal of the current dividing element, and a terminal K of the light source is connected to a second terminal of the current dividing element; or, the negative probe-point is connected to the terminal A of the light source, the positive probe-point is connected to the first terminal of the current dividing element, and the terminal K of the light source is connected to the second terminal of the current dividing element;
wherein the positive probe-point and the negative probe-point are electrically connected with each other so that the light source is connected in parallel with the current dividing element when detecting an electrostatic damage, and the positive probe-point and the negative probe-point are disconnected from each other so that the current dividing element is disconnected from the light source when the electrostatic damage detection is not conducted.

2. The backlight module of claim 1, wherein the current dividing element comprises at least one second resistor comprising at least one second variable resistor or at least one second constant resistor.

3. The backlight module of claim 1, wherein the light source comprises a light emitting diode.

4. The backlight module of claim 1, further comprising a detection pin disposed on the circuit board and electrically connected with the light source.

5. A liquid crystal display module, comprising a backlight module, the backlight module comprising: a circuit board; at least one light source disposed on the circuit board; a current dividing element disposed on the circuit board; and a positive probe-point and a negative probe-point, both located on the circuit board and electrically connected to the light source, wherein, the positive probe-point and the negative probe-point are disposed on a projecting portion of the circuit board;
the positive probe-point is connected to a terminal A of the light source, the negative probe-point is connected to one terminal of the current dividing element, and a terminal K of the light source is connected to another terminal of the current dividing element; or, the negative probe-point is connected to the terminal A of the light source, the positive probe-point is connected to one terminal of the current dividing element, and the terminal K of the light source is connected to another terminal of the current dividing element;
wherein the positive probe-point and the negative probe-point are electrically connected with each other so that the light source is connected in parallel with the current dividing element when detecting an electrostatic damage, and the positive probe-point and the negative probe-point are disconnected from each other so that the current dividing element is disconnected from the light source when the electrostatic damage detection is not conducted.

\* \* \* \* \*